US006797956B2

(12) United States Patent
Benner

(10) Patent No.: US 6,797,956 B2
(45) Date of Patent: Sep. 28, 2004

(54) ELECTRON MICROSCOPE WITH ANNULAR ILLUMINATING APERTURE

(75) Inventor: Gerd Benner, Aalen (DE)

(73) Assignee: Leo Elektronenmikroskopie GmbH, Oberkochen (DE)

(*) Notice: Subject to any disclaimer, the term of this patent is extended or adjusted under 35 U.S.C. 154(b) by 0 days.

(21) Appl. No.: 10/339,276

(22) Filed: Jan. 9, 2003

(65) Prior Publication Data
US 2003/0132383 A1 Jul. 17, 2003

(30) Foreign Application Priority Data
Jan. 10, 2002 (DE) .......................... 102 00 645

(51) Int. Cl.[7] .............................................. H01J 37/26
(52) U.S. Cl. ..................................................... 250/311
(58) Field of Search ........................................ 250/311

(56) References Cited

U.S. PATENT DOCUMENTS 5,814,815 A    9/1998   Matsumoto et al.
2002/0086317 A1 * 7/2002 Nagayama ....................... 435/6
2002/0148962 A1 * 10/2002 Hosokawa et al. ......... 250/311

FOREIGN PATENT DOCUMENTS

EP          02023322        5/2003

* cited by examiner

Primary Examiner—John R. Lee
Assistant Examiner—James J. Leybourne

(57) ABSTRACT

In a transmission electron microscope with phase contrast imaging, the illumination of the object to be imaged takes place with an annular illuminating aperture. An annular phase-shifting element with a central aperture is arranged in a plane Fourier transformed with respect to the object plane. The annular phase-shifting element confers a phase shift of $\pi/2$ on a null beam, while the radiation of higher diffraction orders diffracted at the object in the direction of the optical axis passes through the central aperture of the annular phase-shifting element and consequently is not affected, or only slightly affected, by the phase-shifting element. The annular illuminating aperture is preferably produced sequentially in time by a deflecting system, which produces a beam tilt in a plane conjugate to the object plane.

11 Claims, 4 Drawing Sheets

Combinad Aperture Diaphragm with Phase Plate

Self-Supporting Phase Annulus

ELECTRON MICROSCOPE WITH ANNULAR ILLUMINATING APERTURE

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

Phase contrast microscopy is of great importance in light microscopy for making biological structures visible which have no or only little amplitude contrast. The production of the phase contrast takes place in that different diffraction orders of the radiation diffracted at the object and already having a phase difference of $\pi/2$ due to the diffraction effect, have an additional phase shift of likewise $\pi/2$ impressed upon them, different for the different diffraction orders, by means of a phase plate. In light microscopy, phase contrast according to Zernike is produced in that an annular diaphragm is arranged in the pupil plane of the condenser, and a phase plate is arranged in the exit side focal plane of the microscope objective and impresses on the null beam, i.e., the light not diffracted at the object, a phase displacement which differs by $\pi/2$ from the phase displacement impressed on the higher diffraction orders. This method is not easily transferred to electron optics, since on one hand a submicroscopic annular diaphragm would be required in the illuminating system because of the small illuminating aperture, and on the other hand, no suitable support material is available which is completely transparent to electrons.

Various methods have already been proposed for the production of phase contrast in electron microscopy. One possibility is to use the phase-shifting effect of the aperture error of the objective in combination with a defocusing of the objective. However, the thereby produced phase contrast for a given defocus- and aperture error coefficient depends on the spatial frequency of the respective image information and is described by the so-called "phase contrast transfer function" (PTCF). As a rule, however, such phase contrasts can only be made visible in a strong under-focus, in which the PCTF strongly oscillates, which then makes the interpretation of the image produced very difficult or even impossible.

A further possibility for the production of phase contrast in electron microscopy is described in an article by Boersch in Zeitschrift für Wissenschaften 2a, 1947, pages 615 ff. According to this, the phase displacement of the electron beam by external electrical and/or magnetic potentials or by the use of the internal potential on passage through a thin foil is used. In the latter principle, the phase plate consists of a thin carbon foil with a thickness of 20 nm with a central hole, through which the null beam can pass unaffected. The diffracted beams pass through the foil and undergo a phase displacement by $\pi/2$. This principle has substantial disadvantages, however. For one thing, the hole diameter of the central hole has to be of the order of magnitude of about 1 $\mu$m, since the illuminating apertures and hence the expansion of the null beam in the focal plane is correspondingly small. The production and centering of such small holes relative to the electron beam is very problematic. Furthermore, the thickness of the foil can change greatly due to contamination, and the central hole for the null beam can quickly become overgrown due to contamination. The unavoidable electrical charging of the foil results in an additional anisotropic phase displacement, so that the total phase displacement produced becomes relatively uncontrollable. Finally, the higher diffraction orders of the radiation diffracted at the object, and already having a weaker intensity than the null beam, is additionally weakened in its intensity by the foil due to elastic and inelastic scattering, so that the contrast produced is correspondingly weak.

The first principle described in the abovementioned article, the use of the phase displacing effect of an external electrical potential, is further taken up in U.S. Pat. No. 5,814,815. An electrostatic single lens is used there for the displacement of the phase of the null beam with respect to the higher diffraction orders of the radiation diffracted at the object. Micromechanical manufacturing methods have to be used for the production of the single lens, because of the small spatial distances of the different diffraction orders. The construction of the annular electrostatic single lenses in a central position, and the supporting structures required for this, effect a stopping-out of the diffraction information. A further disadvantage is that the single lenses have to be of cantilevered construction and are therefore very difficult to implement. Further difficulties arise from the insulation of the middle electrode, since care must be strictly taken that no insulating materials, which could become charged by the electron beam, are present in the neighborhood of the beam. And here also the small central bore can quickly become polluted and overgrown due to contamination, as in the above-described alternative with the perforated foil.

SUMMARY OF THE INVENTION

The present invention therefore has as its object to provide an electron microscope with which the production of easily interpretable phase contrast images is possible and which has no components which are critical as regards production and for lasting retention of function. In particular, no cantilevered structures are to be required, i.e., structures held by thin supporting webs which bridge over the region of the beam cross section required for the production of the image.

The object of the invention is achieved by a transmission electron microscope with an optical axis, comprising an illuminating system for illuminating with an electron beam an object to be positioned in an object plane, and an objective for imaging the illuminated object; wherein the electron beam is split at the object into a null beam and higher diffraction orders; wherein the illuminating system produces an annular illuminating aperture in a Fourier transformed plane relative to the object plane; and wherein a phase-shifting element is arranged in a focal plane of the objective, remote from the object plane, and confers on the null beam a phase shift with respect to radiation diffracted at the object into higher diffraction orders; and wherein the phase-shifting element does not affect, or only slightly affects, the phase of the radiation diffracted at the object into higher diffraction orders and running closer in a radial direction to the optical axis than the null beam.

In the electron microscope according to the invention, the phase contrast is produced in a manner very similar to the production of phase contrast in light microscopy. The illuminating system of the electron microscope produces an annular illuminating aperture in a plane which is Fourier transformed with respect to the object plane to be imaged. As in phase contrast microscopy, the illumination of the object to be imaged consequently takes place with a beam of hollow conical shape. In the plane which is Fourier transformed with respect to the object plane or a plane conjugate thereto, a phase-shifting element is arranged which confers on the radiation undiffracted at the object, i.e., the null beam, a phase displacement with respect to the radiation diffracted at the object in higher diffraction orders. At the same time, the phase-shifting element permits the phase to be unaffected, or only slightly affected, of the radiation diffracted at the object at higher diffraction orders and running closer to the optical axis in the radial direction than the null beam.

In a transmission electron microscope according to the invention, as in phase contrast n light microscopy, a phase displacement is conferred by the phase-shifting element on the radiation undiffracted at the object with respect to the radiation diffracted at the object. The radiation diffracted at the object in higher orders of diffraction and running, in the plane of the phase-shifting element, closer to the optical axis in the radial direction than the radiation undiffracted at the object, is on the other hand not affected by the phase-shifting element. A corresponding phase-shifting element can therefore be constituted of annular shape with a central aperture. Such an annular phase-shifting element can consequently be mounted at its outer circumference, so that no cantilevered or nearly cantilevered structures are required. It even provides electron-optical advantages when the phase-shifting element or a retaining structure of the phase-shifting element stops-out the higher diffraction orders situated further from the optical axis in the radial direction with respect to the null beam. The negative effects of the off-axis aberrations of the objective are thereby reduced.

Furthermore, the phase-shifting element not only affects the phase of the null beam but also simultaneously weakens the intensity of the null beam due to a corresponding absorption. An overall improvement of contrast is achieved by the intensity matching which can be thereby attained between the null beam and the higher diffraction orders. A very stable construction of the phase-shifting element can be implemented by a combination of the phase-shifting element with an aperture diaphragm. The radiation of higher order diffracted toward the optical axis can pass unhindered through the central aperture of the phase-shifting element, while the radiation diffracted away in a radial direction from the optical axis is stopped-out. However, information is not lost by this stopping-out, since the illuminating beam rotated by 180° relative to the optical axis contains the information complementary to the stopped-out diffraction orders.

A corresponding phase-shifting element is technologically simple to implement. The information-carrying diffracted beam of higher order does not undergo any negative effects, such as an attenuation or an additional phase shift due to its unhindered passage through the phase-shifting element, due either to the construction of the phase-shifting element or to its support. Moreover, no radiation diffracted in given spatial directions is completely stopped-out by support structures. The corresponding phase-shifting element can on the contrary be constituted rotationally symmetrical with respect to the optical axis.

Furthermore, small holes in the phase-shifting element, through which the primary beam has to pass, are avoided. Negative effects of contamination effects in addition arising with small holes are thereby substantially excluded. And since only information of null diffraction order, carrying no information about the object, passes through the phase-shifting element, variations of the phase shift due to local thickness fluctuations of the phase-shifting element are statistically equalized.

In an embodiment of the invention, the phase-shifting element is constituted as an annular electrode, whose electrostatic potential is variable.

In an alternative embodiment of the invention, the phase-shifting element is constituted as an annular foil, which is received on a heavy support. Both the annular foil and the heavy support respectively have an aperture directed perpendicularly of the optical axis, the diameter of the aperture in the annular foil being smaller than the aperture diameter of the heavy support. The heavy support can then serve at the same time as an aperture diaphragm for stopping-out the higher diffraction orders diffracted away from the optical axis.

A deflecting system is preferably provided in a plane conjugate to the object plane in order to produce the annular illuminating aperture. In this embodiment, the annular illuminating aperture is produced sequentially in time by variation of the deflection angle.

An alternative production of the annular illuminating aperture is also possible by means of a corresponding diaphragm with a central shadowing in the illuminating beam path. Furthermore, it is possible, particularly with thermal emitters as the electron source, to image the underheated cathode image (hollow beam), which already has an annular emission distribution with a weak central maximum, in the front focal plane of the condenser-objective-single field lens, and to stop-out the central emission spot, in order to produce the annular illuminating aperture.

BRIEF DESCRIPTION OF THE DRAWINGS

Further details and advantages of the present invention are explained hereinafter using the embodiment examples shown in the accompanying drawings.

DETAILED DESCRIPTION OF THE INVENTION

Figure 1:
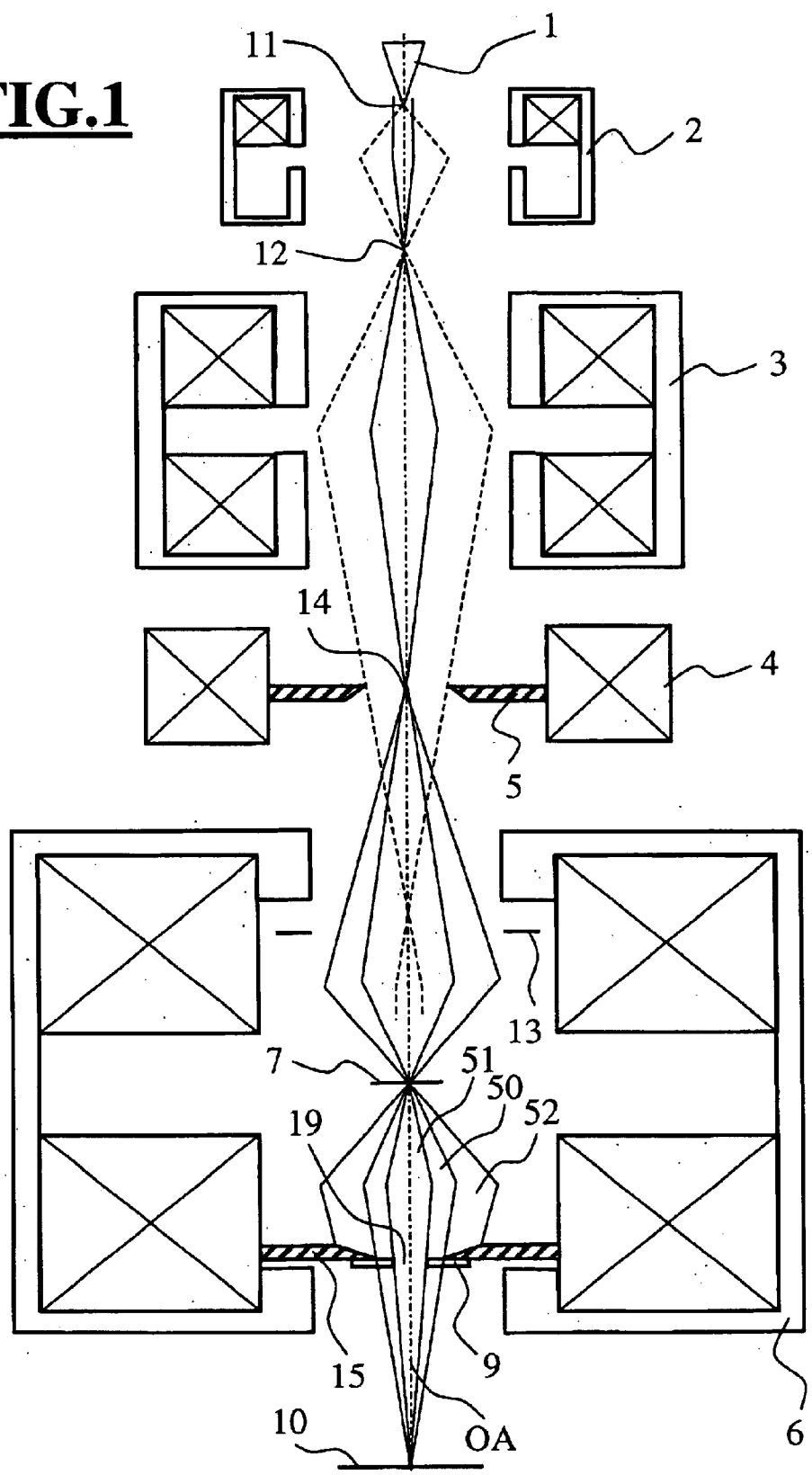
FIG. 1 shows, in section, a principle sketch of a transmission electron microscope according to the invention.

The transmission electron microscope shown in FIG. 1 has a beam producer (1) and a condenser (2, 3, 6) having three stages in all. The beam producer (1) is preferably a field emission source or a Schottky emitter The first condenser lens (2) produces a real image (12) of the crossover (11) of the beam producer (10). This real crossover image (12) is imaged by the second condenser lens (3) as a real image in the source-side focal plane (13) of the third condenser lens (6). The third condenser lens (6) is a so-called condenser objective single field lens, the pre-field of which serves as a condenser lens and the back field of which serves as an objective lens, and in which the object plane (7) is situated in the middle of the pole shoe gap of the condenser objective single field lens (6). The object plane (7) is illuminated by a partial beam aligned parallel to the optical axis by the imaging of the crossover (11) of the particle producer (1) in the source-side focal plane (14) of the condenser objective single field lens (6). The corresponding illuminating beam path is shown dashed in FIG. 1.

A field diaphragm (5) and a deflecting system (4), or the changeover point of a double deflection system, are arranged in the plane conjugate to the object plane (7) on the source side. The particle beam is tilted by the deflecting system (4) by the same angle in the plane of the field diaphragm (5) to each point (14) conjugate to an object point. A corresponding tilting of the particle beam in the object plane (7) is produced by this deflection or tilting of the particle beam. A rotating beam, which corresponds, sequentially in time, to a hollow conical illuminating aperture, results in the object plane (7) by means of action on the deflecting system (4) in two mutually perpendicular directions corresponding to a sine function in one direction and a cosine function in the perpendicular direction thereto, with an amplitude which is constant and identical in time in both mutually perpendicular directions. The internal diameter of the annular illuminating aperture is determined and adjustable by adjusting the amplitude of the deflection produced by the deflection system (4). The annular diameter of the annular illuminating aperture is, on the contrary, determined by the imaging scale at which the crossover (11) of the particle beam producer (1) is imaged in the source-side focal plane (13) of the condenser objective single field lens (6).

The beam cone with a hollow conical illuminating aperture, sequential in time, is focused in the intermediate image plane (10) by means of the back field or imaging field of the condenser objective single field lens (6), so that a real image of the object plane (7) arises in the intermediate image plane (10). The annular phase-shifting element (9) is received in the rear focal plane (15) on the intermediate image side of the condenser objective field lens, in the region of the central aperture of an aperture diaphragm (8). This annular phase-shifting element has a large central aperture (19)—with a diameter of a few tens of micrometers, preferably at least 30 $\mu$m—through which the radiation of higher order (51), diffracted toward the optical axis (OA) with respect to the undiffracted radiation (null beam) (50), can pass unhindered. At the same time, the phase-shifting element (9) confers on the radiation undiffracted at the object, that is, the null beam (50), a phase shift of preferably $\pi/2$. A superposition takes place in the intermediate image plane (10) of the phase-shifted null beam (50) onto the radiation (51) diffracted toward the optical axis. Those higher diffraction orders (52) diffracted at the object which run further apart from the optical axis in the plane of the phase-shifting element (9) than the undiffracted radiation, are on the contrary absorbed by the aperture diaphragm (8).

Figure 2:
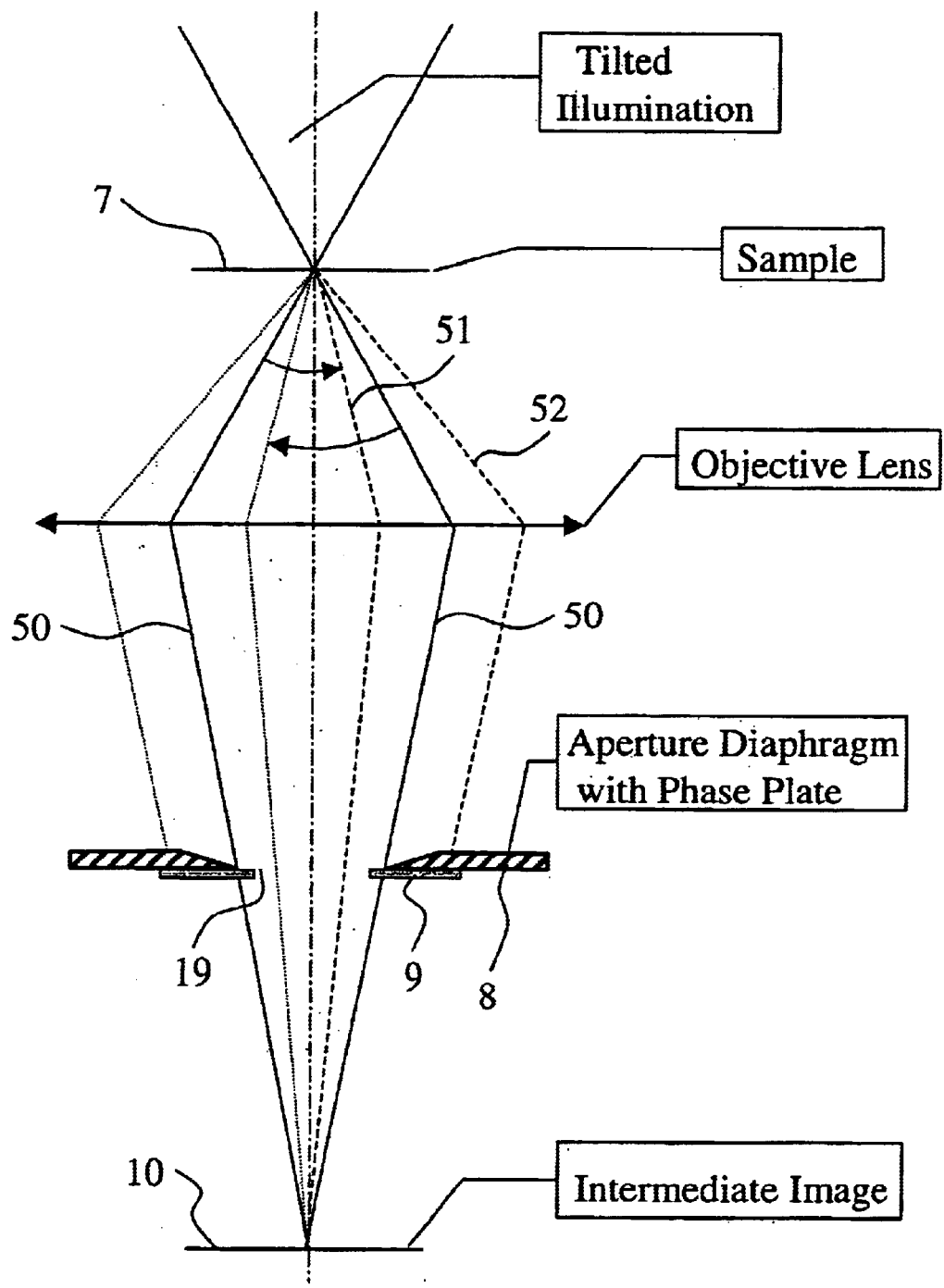
FIG. 2 shows an excerpt from the principle sketch of FIG. 1.

Reference is made to FIG. 2 as regards the positions of the various diffraction orders relative to the phase-shifting element (9), and the resulting mode of operation of the arrangement according to the invention. The two respective null beams (50) are shown there by full lines, the two respective first plus diffraction orders by dashed lines, and the respective two first minus diffraction orders by dotted lines, of the two illuminating beams drawn in. Both the first plus and also the first minus diffraction orders (51), which in the plane of the phase-shifting element run closer to the optical axis than the null beam, pass unaffected through the central aperture (10) in the phase-shifting element (9). The beam undiffracted at the specimen (null beam) undergoes the desired phase shift at the annular phase-shifting element (9) and the likewise desired attenuation, while the two higher diffraction orders (52) remote from the axis are completely eliminated by the diaphragm (8).

As can be understood from FIGS. 1 and 2 overall, each point in the object plane (7) is illuminated by an electron beam which has an illuminating aperture of hollow conical shape. The vertex of the illuminating beam cone is situated in the object plane (7). The beam bundle with an illuminating aperture of divergent hollow conical shape further proceeding from the object plane is imaged by the after-field of the condenser objective single field lens (6) in the intermediate image plane (10). A phase contrast image of the specimen arranged in the object plane (7) arises in the intermediate image plane (10) by interference of higher diffraction orders (51) passing through the central aperture (19) of the phase-shifting element (9) with the null beam (50) phase-displaced by the phase-shifting element. Since respectively the mutually diametrally opposite illuminating beams provide the diffraction information of the complementary half-space, the diffraction information is completely present over the specimen, and the stopping-out of the higher diffraction orders diffracted away from the optical axis leads only to an intensity loss by a factor ½. This intensity loss is however relatively uncritical and is more than compensated by the other advantages of the present invention.

Figure 3A:
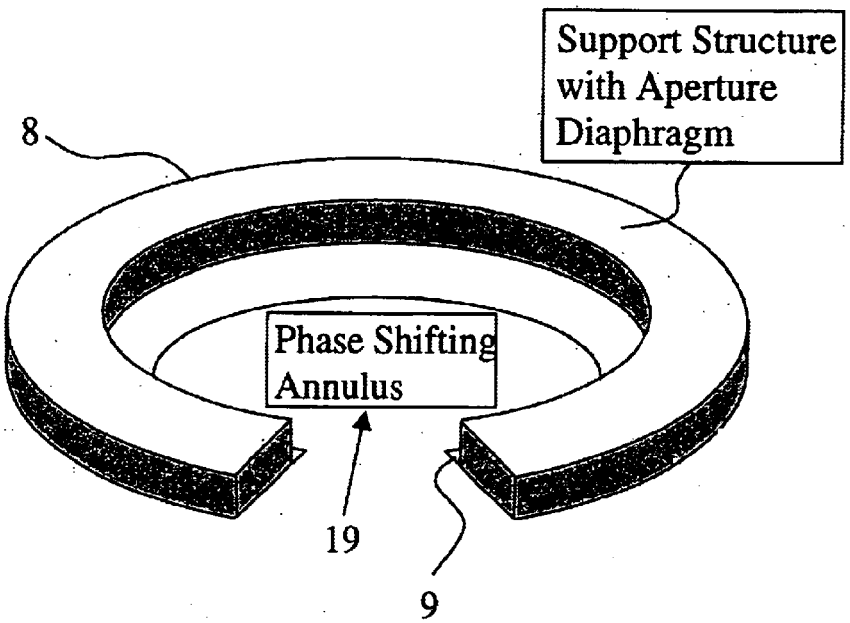
FIGS. 3a and 3b show two embodiment examples for phase-shifting elements in the form of a foil, in a sectioned perspective view.

A first embodiment example of a phase-shifting element is shown in FIG. 3a. It has an annular support structure (8) of an electrically conductive material. The support structure (8) has a central aperture (19). A thin annular membrane (9) is received on the support structure (8) in the region of the central aperture (19), and projects slightly into the central aperture (19) of the support structure (8). The support structure (8) serves at the same time as the aperture diaphragm for stopping-out the radiation of higher order diffracted away from the optical axis. A mechanically and electrically very stable construction results from the small overlap of the foil and the radial fastening of the foil membrane (9) to the support structure (8) over the full diameter. Possible charging of the foil is thereby avoided because the charge can dissipate via the support structure (8).

Figure 3B:
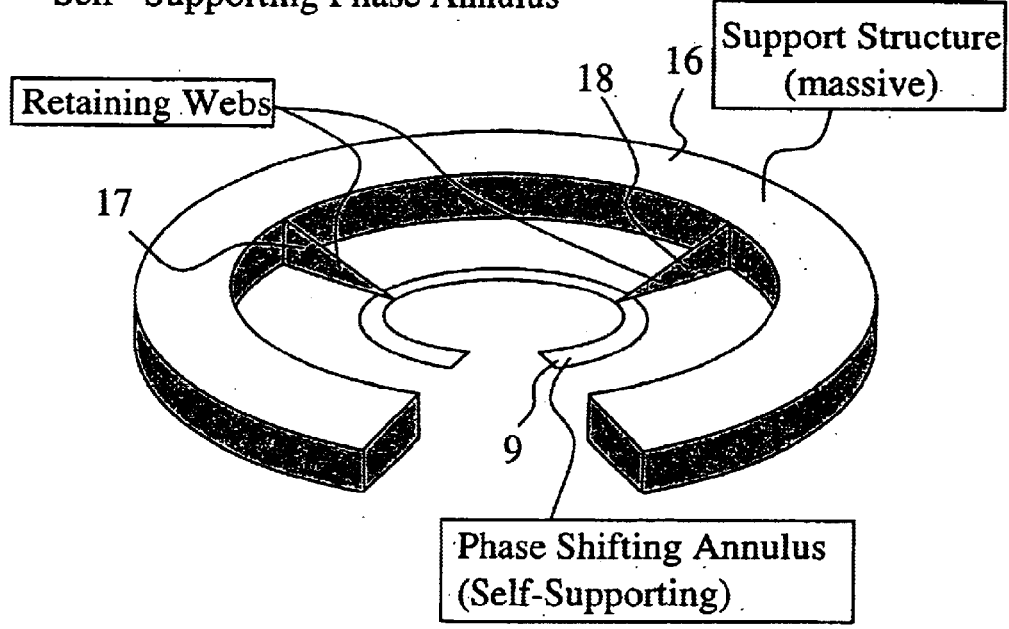

The embodiment example in FIG. 3b differs from the embodiment example in FIG. 3a only in that the phase-shifting element (9) constituted as a thin membrane is received on the support structure (16) by means of two thin retaining webs (17, 18) (a third retaining web is situated in the cut-away region in FIG. 3 and is therefore not visible). This embodiment in FIG. 3b has the advantage over the embodiment shown in FIG. 3a that even the higher diffraction orders diffracted away from the optical axis can contribute to the image production, but at the cost of smaller stability and higher technical expense.

In both embodiments in FIGS. 3a and 3b, the membrane (9) can be received, electrically insulated, on the respective support structure (8, 16), so that the membrane can be acted on by an electrical potential with respect to the support structure. The phase-shifting effect may thereby be varied.

Figure 4:
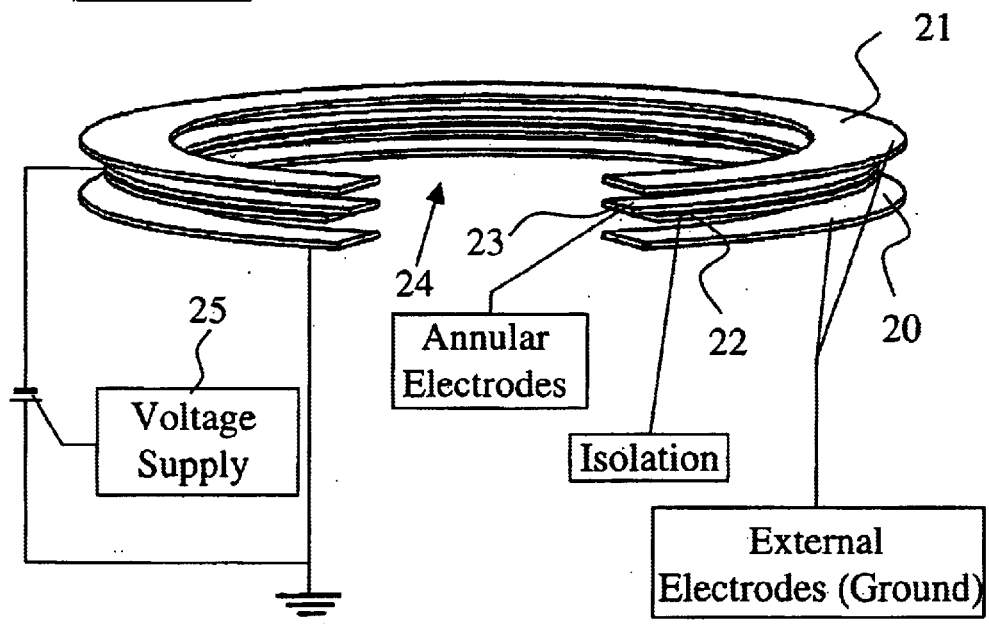
FIGS. 4 and 5 show two embodiment examples of phase-shifting elements constituted as annular electrodes, in a sectioned perspective view.

A relatively simple embodiment example of an electrostatic phase-shifting element is shown in FIG. 4. This phase-shifting element contains the mutually coaxial annular electrodes (21, 22, 23) having a circular central aperture (24), arranged one behind the other in the direction of the optical axis. The middle electrode (23) is insulated with respect to the two outer annular electrodes (20, 21) by an insulator (22). The two outer annular electrodes (20, 21) are at the identical potential, the potential of the electron-optical tube in the region of the phase-shifting element, and the middle electrode (23) can be placed at a potential which is different with respect to the two outer electrodes (20, 21) by means of a voltage supply (25). Since the undiffracted radiation at the object (7) (null beam) runs closer to the middle electrode (23) than the radiation of higher order diffracted toward the optical axis, the null beam undergoes a phase displacement due to the potential difference between the middle electrode (23) and the two outer electrodes (20, 21), while the radiation of higher order diffracted toward the optical axis (middle of the central aperture 24) undergoes no, or only a slight, constant phase shift.

Also in the embodiment example in FIG. 4, the electrode geometry serves for stopping-out the higher diffraction orders which were diffracted away from the optical axis by the object.

This simple embodiment example of an electrostatic phase-shifting element gives particularly good results in systems in which the beam producer produces only a small illuminating aperture, i.e., particularly in systems with a field emission source or Schottky emitter. The reason for this is that the phase shift varies as the square of the distance from the center of the central aperture (24). As a result, the beams remote from the center undergo a markedly greater phase shift than those close to the center. Within each diffraction order, the phase shift is consequently not constant, but increases from inside to outside, which particularly entails disadvantages at large illuminating apertures. However, with field emission sources and Schottky emitters, the illuminating aperture is sufficiently small, so that the variation of the phase shift within the null beam is only a few percent. Hence it is possible to adjust the desired phase shift by π/2 for the undiffracted radiation by choice of a suitable potential difference between the middle electrode (23) and the two outer electrodes (20, 21). The central aperture (24) of the three mutually coaxially arranged electrodes (20, 21, 23) then has an internal diameter of about 50 μm and thus dimensions which are technologically easy to control.

Figure 5:
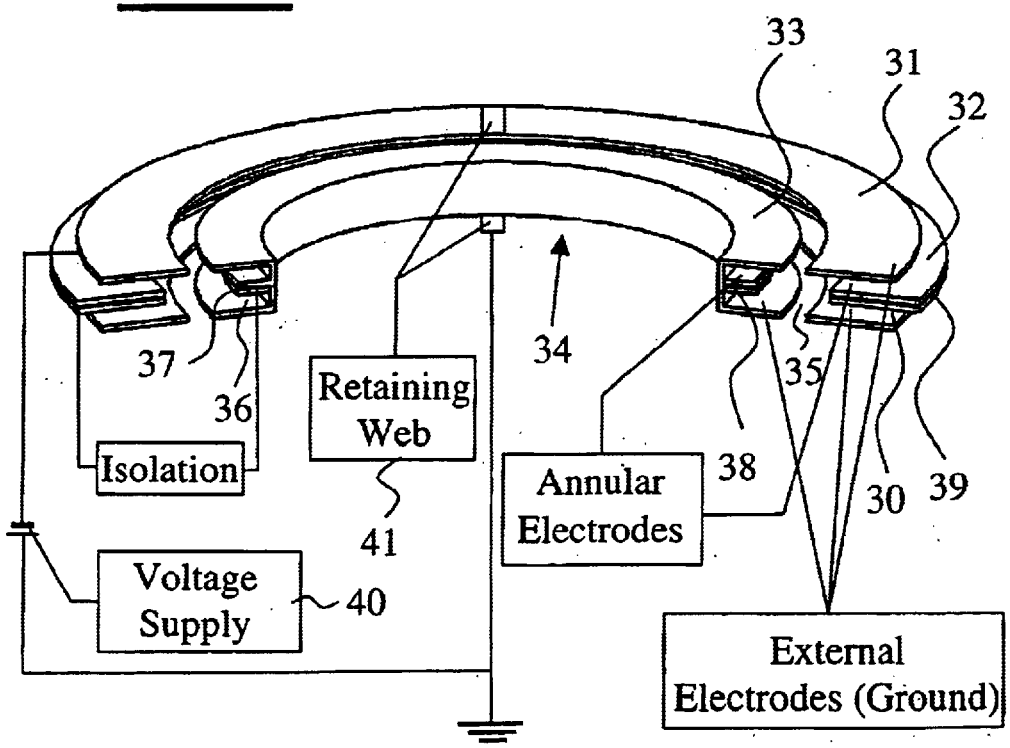

A further embodiment of an electrostatic phase-shifting element, shown in FIG. 5, has a somewhat more costly construction than the embodiment example in FIG. 4. As in the embodiment example of FIG. 4, there are again three outer annular electrodes (30, 31, 39) arranged coaxially here, the middle electrode (39) being insulated from the other electrodes by an insulator (32). A likewise annular screening electrode (33) is arranged within the central aperture (34) of the three coaxial annular electrodes (30, 31, 39), and in the sectional plane including the optical axis has a U-shaped profile, with the opening of the U outward, toward the outer electrodes (30, 31, 39). The external diameter of this annular screening electrode is smaller than the internal diameter of the central aperture in the two outer electrodes (30, 31), so that an annular gap (35) is provided between the screening electrode (33) and the outer electrodes (30, 31). This annular gap (35) serves for the null beam to pass through. The screening electrode (33) has in the radial direction a recess (36) in which a further annular electrode (38) is received by means of an insulator (37). The further annular electrode (38) arranged in the recess of the screening electrode (33) is situated opposite the middle electrode (30) of the three outer annular electrodes (30, 31, 39).

In this embodiment example, the two outer electrodes (30, 31) and the screening electrode (33) are at the same potential, while the two inner annular electrodes (38, 39) can be placed at a potential differing from this by means of a voltage supply (40). This potential difference between the two inner electrodes (38, 39) and the outer electrodes (30, 31, 33) is now again adjusted so that the null beam passing through the annular aperture (35) undergoes the desired phase shift of π/2. The screening electrode (33) ensures that the potential is constant in the interior of the circular aperture of the screening electrode (33), and consequently the higher diffraction orders of the radiation diffracted at the object undergo no phase shift.

The embodiment of FIG. 5 is admittedly more costly as regards its production than the embodiment in FIG. 4; however, it is simultaneously attained that the phase shift undergone by the null beam is constant over the aperture and likewise the higher diffraction orders undergo no phase shift at all.

Retaining webs (41) not shown in FIG. 5 can be provided to receive the screening electrode (33) on the two outer electrodes (30, 31). These retaining webs do not have disadvantageous effects, however, since they attenuate only the null beam and consequently on no account eliminate the diffraction information which is specific for the irradiated object.

In contrast to the phase-shifting elements constituted as membranes, the phase-shifting elements constituted as annular electrode(s) corresponding to the embodiments in FIGS. 4 and 5 provide the advantage that the phase displacement takes place without passage through an interfering material and that a variable phase shift can be adjusted by variation of the potential between the inner annular electrode(s) and the outer electrodes.

I claim:

1. A transmission electron microscope with an optical axis, comprising an illuminating system for illuminating with an electron beam an object to be positioned in an object plane, and an objective for imaging the illuminated object;

wherein the electron beam is split at the object into a null beam and higher diffraction orders; wherein the illuminating system produces an annular illuminating aperture in a Fourier transformed plane relative to the object plane; and wherein a phase-shifting element is arranged in a focal plane of the objective, remote from the object plane, and confers on the null beam a phase shift with respect to radiation diffracted at the object into higher diffraction orders; and wherein the phase-shifting element does not affect, or only slightly affects, the phase of the radiation diffracted at the object into higher diffraction orders and running closer in a radial direction to the optical axis than the null beam.

2. Transmission electron microscope according to claim 1, wherein the phase-shifting element, or a supporting structure of the phase-shifting element, stops-out higher diffraction orders which are situated more remote from the optical axis in the radial direction with respect to the null beam.

3. Transmission electron microscope according to claim 1, wherein the phase-shifting element comprises annular form with a central aperture.

4. Transmission electron microscope according to claim 1, wherein the phase-shifting element attenuates the null beam in intensity.

5. Transmission electron microscope according to claim 1, wherein a field emission source or a Schottky emitter is provided as the electron source.

6. Transmission electron microscope according to claim 1, wherein the phase-shifting element has an annular electrode.

7. Transmission electron microscope according to claim 6, wherein the potential of the annular electrode is variable with respect to the surrounding potential.

8. Transmission electron microscope according to claim 1, wherein the phase-shifting element comprises an annular foil on a heavy support, wherein the annular electrode and heavy support respectively comprises an aperture aligned perpendicular to the optical axis, and wherein the aperture diameter of the foil is smaller than the aperture diameter of the support.

9. Transmission electron microscope according to claim 8, wherein the annular foil is electrically insulated with respect to the support.

10. Transmission electron microscope according to claim 1, wherein a deflecting system for the production, sequentially in time, of the annular illuminating aperture is arranged in a source-side plane conjugate to the object plane.

11. Transmission electron microscope according to claim 10, wherein the deflecting system produces a deflection of the electron beam in two mutually perpendicular directions, and wherein the deflection in one direction is of sine form, and in the direction perpendicular thereto, of cosine form, as a function of time, and wherein the amplitude of the sine-form or cosine-form deflection is identical and constant in time.

* * * * *